United States Patent
Xu et al.

(10) Patent No.: US 10,686,100 B2
(45) Date of Patent: Jun. 16, 2020

(54) QUARTENARY LED WITH TRANSPARENT SUBSTRATE AND ALIGNED ELECTRODES

(71) Applicant: Yangzhou Changelight Co., Ltd., JiangSu Province (CN)

(72) Inventors: Zhou Xu, JiangSu Province (CN); Bo Li, JiangSu Province (CN); Kaixuan Chen, JiangSu Province (CN); Yuren Peng, JiangSu Province (CN); Guoqing Zhang, JiangSu Province (CN)

(73) Assignee: Yangzhou Changelight Co., Ltd., Jiangsu (CN)

( * ) Notice: Subject to any disclaimer, the term of this patent is extended or adjusted under 35 U.S.C. 154(b) by 0 days.

(21) Appl. No.: 16/111,117

(22) Filed: Aug. 23, 2018

(65) Prior Publication Data
US 2019/0067525 A1    Feb. 28, 2019

(30) Foreign Application Priority Data
Aug. 25, 2017    (CN) ......................... 2017 1 0743511

(51) Int. Cl.
*H01L 33/44*    (2010.01)
*H01L 33/00*    (2010.01)
(Continued)

(52) U.S. Cl.
CPC .......... *H01L 33/44* (2013.01); *H01L 33/0062* (2013.01); *H01L 33/0079* (2013.01);
(Continued)

(58) Field of Classification Search
None
See application file for complete search history.

(56) References Cited

U.S. PATENT DOCUMENTS

| 5,359,209 A | * | 10/1994 | Huang | ............... H01L 33/0025 |
| | | | | 257/103 |
| 5,404,031 A | * | 4/1995 | Sasaki | ............... H01L 33/0062 |
| | | | | 257/95 |

(Continued)

FOREIGN PATENT DOCUMENTS

| CN | 101937960 A | 1/2011 |
| CN | 104300059 A | 1/2015 |

(Continued)

OTHER PUBLICATIONS

International Search Report and Written Opinion issued in PCT/IB2018/056408 dated Dec. 13, 2018, 10 pages.

*Primary Examiner* — Anthony Ho
*Assistant Examiner* — Kevin Quinto
(74) *Attorney, Agent, or Firm* — Arch & Lake LLP

(57) ABSTRACT

A light-emitting diode (LED) device (e.g., AlGaInP LED) includes a transparent substrate, an epitaxial structure defining an isolation trench and an epitaxial structure, an insulating passivation layer, a P electrode and an N electrode. The epitaxial structure is disposed above the transparent substrate. The isolation trench divides the epitaxial structure into a first portion and a second portion. The at least one through hole extends through the first portion. At least a portion of the insulating passivation layer is disposed in the isolation trench. The P electrode is disposed above the first portion of the epitaxial structure and in the at least one through hole. The N electrode is disposed above the second portion of the epitaxial structure. A top surface of the P electrode is horizontally aligned with a top surface of the N electrode.

18 Claims, 5 Drawing Sheets

(51) Int. Cl.
  *H01L 33/06* (2010.01)
  *H01L 33/14* (2010.01)
  *H01L 33/30* (2010.01)
  H01L 33/38 (2010.01)
  H01L 33/46 (2010.01)

(52) U.S. Cl.
  CPC ............. *H01L 33/06* (2013.01); *H01L 33/14* (2013.01); *H01L 33/30* (2013.01); *H01L 33/382* (2013.01); *H01L 33/387* (2013.01); *H01L 33/46* (2013.01); *H01L 2933/0016* (2013.01); *H01L 2933/0025* (2013.01)

(56) References Cited

U.S. PATENT DOCUMENTS

| | | | | |
|---|---|---|---|---|
| 2006/0056123 | A1* | 3/2006 | Aoyagi | H01L 25/167 361/56 |
| 2012/0126259 | A1* | 5/2012 | Mizutani | H01L 27/156 257/88 |
| 2017/0170369 | A1* | 6/2017 | Chuang | H01L 33/50 |

FOREIGN PATENT DOCUMENTS

| | | |
|---|---|---|
| CN | 105448732 A | 3/2016 |
| CN | 106129224 A | 11/2016 |
| CN | 107546303 A | 1/2018 |

* cited by examiner

500

505 Sequentially epitaxially grows layers on a GaAs temporary substrate, to form an AlGaInP-based LED epitaxial structure

↓

510 Deposit a transparent conductive oxide layer as a current expansion layer on the P-type GaP window layer of the epitaxial structure

↓

515 Bond the epitaxial structure to a transparent substrate by using a transparent bonding material

↓

520 Remove the GaAs temporary substrate, the GaAs buffer layer and the GaInP etch-stop layer

↓

525 Form a pattern on the surface of the N-type GaAs ohmic contact layer by, e.g., lithography

↓

530 Deposit a dialectic film on the surface of the N-type GaAs ohmic contact layer, as a dielectric film layer of an ODR, and forming through holes of the dielectric film by a lift-off process

↓

535 Deposit a metal reflective layer on the surface of the dielectric film layer, as the metal reflective layer of the ODR

↓

540 Form an isolation trench between the P electrode and the N electrode and at least one through hole (or multiple through holes) below the P electrode

↓

545 Deposit a passivation layer

↓

550 Form the P electrode and the N electrode by a deposition and lift-off process

↓

555 Finalize an LED chip by further processes such as substrate thinning, singulation, splitting, etc.

FIG. 5

QUARTENARY LED WITH TRANSPARENT SUBSTRATE AND ALIGNED ELECTRODES

CROSS-REFERENCE TO RELATED APPLICATIONS

This application claims priority to Chinese Patent Application 201710743511.6, filed Aug. 25, 2017, which is incorporated herein by reference in its entirety.

BACKGROUND

Light-emitting diodes (LEDs) are used as semiconductor light sources. Because of various advantages such as high brightness, long product life, small footprint and low power consumption, LEDs are considered to be the choice of the illumination devices of the next generation. A goal for research and development in the LED field is to improve the luminous efficacies of the LEDs and epitaxial wafers for manufacturing LED chips.

Some LED chips include a semiconductor material of aluminum gallium indium phosphide (AlGaInP) grown by heteroepitaxy to form a quantum well structure for emitting light. The AlGaInP-based LED chips can be installed using a flip chip technology. However, due to the height differences of the P and N electrodes of the LED chips, the bonding quality through the flip chip process needs an improvement. Furthermore, the AlGaInP-based LED flip-chips are prone to electrical leakage.

SUMMARY

In one aspect according to some embodiments of the present disclosure, an LED device (e.g., AlGaInP LED) comprises a transparent substrate, an epitaxial structure (also referred to as epitaxial film, epitaxial crystalline overlayer, or epitaxial layer) defining an isolation trench and an epitaxial structure, an insulating passivation layer, a P electrode and an N electrode. The epitaxial structure is disposed above the transparent substrate. The isolation trench divides the epitaxial structure into a first portion and a second portion. The at least one through hole extends through the first portion. At least a portion of the insulating passivation layer is disposed in the isolation trench. The P electrode is disposed above the first portion of the epitaxial structure and in the at least one through hole. The N electrode is disposed above the second portion of the epitaxial structure. A top surface of the P electrode is horizontally aligned with a top surface of the N electrode.

In another aspect according to some embodiments of the present disclosure, an LED device comprises a transparent substrate, an epitaxial structure, a P electrode, an N electrode and an omnidirectional reflector (ODR). The epitaxial structure is disposed above the transparent substrate and the epitaxial structure comprises one or more P-type layers and one or more N-type layers. The P electrode forms an ohmic contact with at least one of the one or more P-type layers. The N electrode forms an ohmic contact with at least one of the one or more N-type layers. The ODR is disposed between the one or more N-type layers of the epitaxial structure and the N electrode, and comprises a dielectric film and a metal reflective layer.

In yet another aspect according to some embodiments of the present disclosure, a method of manufacturing an LED device comprises: fabricating an LED epitaxial structure; bonding the LED epitaxial structure onto a transparent substrate; forming an isolation trench dividing at least some layers of the epitaxial structure into a first portion and a second portion; forming one or more through holes extending through the first portion of the epitaxial structure; and disposing an N electrode above the second portion of the epitaxial structure and a P electrode above the first portion of the epitaxial structure and in the one or more through holes.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 5 schematically illustrates a flow chart of a method of manufacturing an LED chip.

DETAILED DESCRIPTION

Figure 1:
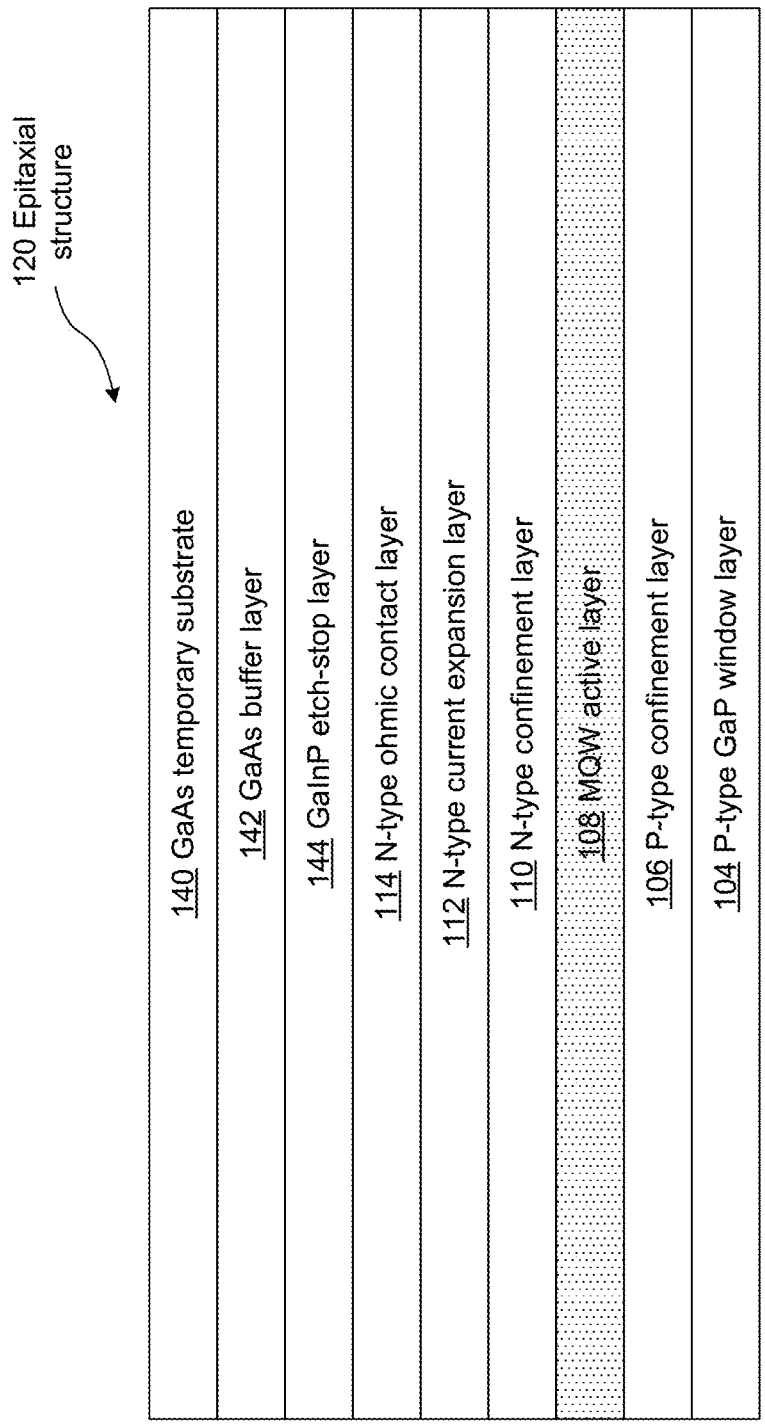
FIG. 1 schematically illustrates an AlGaInP LED epitaxial structure grown on a GaAs substrate.

Semiconductor materials such as AlGaInP are used in LED chips to form quantum well structures for emitting light. AlGaInP-based LEDs are typically vertical structures with P and N electrodes disposed on opposite sides of the LEDs. The substrate may be, e.g., a light-absorbing substrate. Using packaging technologies such as chip scale package (CSP), LED chip packages continue to advance with smaller sizes, higher power densities, and better heat dissipation. In particular, flip-chip LED chips with transparent substrate have the advantages of no soldering during packaging, high light extraction efficacy, small package size and high reliability.

In some embodiments, a quaternary LED (e.g., AlGaInP-based LED) with a transparent substrate can be fabricated. The AlGaInP-LED epitaxial structure has a GaP (gallium phosphide) layer that is coarsened and used as a bonding surface. A film is coated on the bonding surface of the GaP layer. The film is planarized and activated, and then bonded to a transparent substrate. Then, the GaAs layer is removed. The bonding film is an inorganic thin film such as silicon oxide, silicon nitride, aluminum oxide or magnesium chloride.

In some other embodiments, an omnidirectional reflector of an LED having a transparent conductive layer can be fabricated. To improve adhesion between a transparent layer of ITO (indium tin oxide) and a metal reflective layer of Ag (silver), an adhesion layer is inserted between the transparent conductive layer and the metal reflective layer to form an omnidirectional reflector. The omnidirectional reflector of the transparent conductive layer is formed. The LED epitaxial is bonded to a permanent substrate, using a bonding layer such as polyimide (PI), benzocyclobutene (BCB), perfluorocyclobutane (PFCB) or the like. LEDs can be fabricated as both a wire bonding chip (upright mount) and a flip chip.

In yet some other embodiments, a flip-chip AlGaInP LED chip having a transparent substrate can be fabricated. An AlGaInP LED epitaxial structure is grown on a GaAs (gallium arsenide) substrate (also referred to as temporary substrate). A surface of the epitaxial structure is coarsened. The epitaxial structure is bonded to a transparent substrate using adhesive such as bisbenzocyclobutene (bisBCB) resin. Then the GaAs substrate is removed. A P-type AlGaInP mesa is formed by etching. A metal reflective layer and a barrier layer are coated on both the P-type AlGaInP mesa and an N-type AlGaInP surface. P and N electrodes are then fabricated.

However, improvements in those LEDs are desired. For example, the P and N electrodes of the LEDs may not have the same height. The significant height difference causes difficulty for chip packaging and bonding during the flip-chip process. It is difficult to align the LED chip to be parallel with the support base. The chip is prone to roll sideway.

Furthermore, there is no effective isolation between P and N electrodes in the flip-chip LEDs. As a result, during the chip packaging and bonding of the flip-chip process, when the solder may be extruded and deformed and disposed beyond the electrode area. Abnormality such as electrical leakage may occur.

Moreover, the reflectivity is low in those chips. Some of those chips have no reflector. Some of those chips use a reflector including a conductive layer, an adhesion layer and a metal reflective layer, where the conductive layer has a high reflective index. Some of those chips have a metal reflective layer coated on a surface of AlGaInP with a high reflective index, resulting a low reflectivity as well.

According to at least some embodiments of the present disclosure, an LED addressing the above issues is described. FIG. 1 schematically illustrates an AlGaInP LED epitaxial structure grown on a GaAs substrate. As shown in FIG. 1, the AlGaInP LED epitaxial structure 120 may include a GaAs substrate 140, a GaAs buffer layer 142, a GaInP etch-stop layer 144, an N-type ohmic contact layer 114, an N-type current expansion layer 112, an N-type confinement layer 110, a multiple quantum wells (MQW) active layer 108, a P-type confinement layer 106, and a P-type GaP window layer 104. Compared with comparative AlGaInP LED epitaxial structure with metal bonding structure, an N-type coarsened layer may be omitted in the epitaxial structure 120 as shown in FIG. 1.

Figure 2:
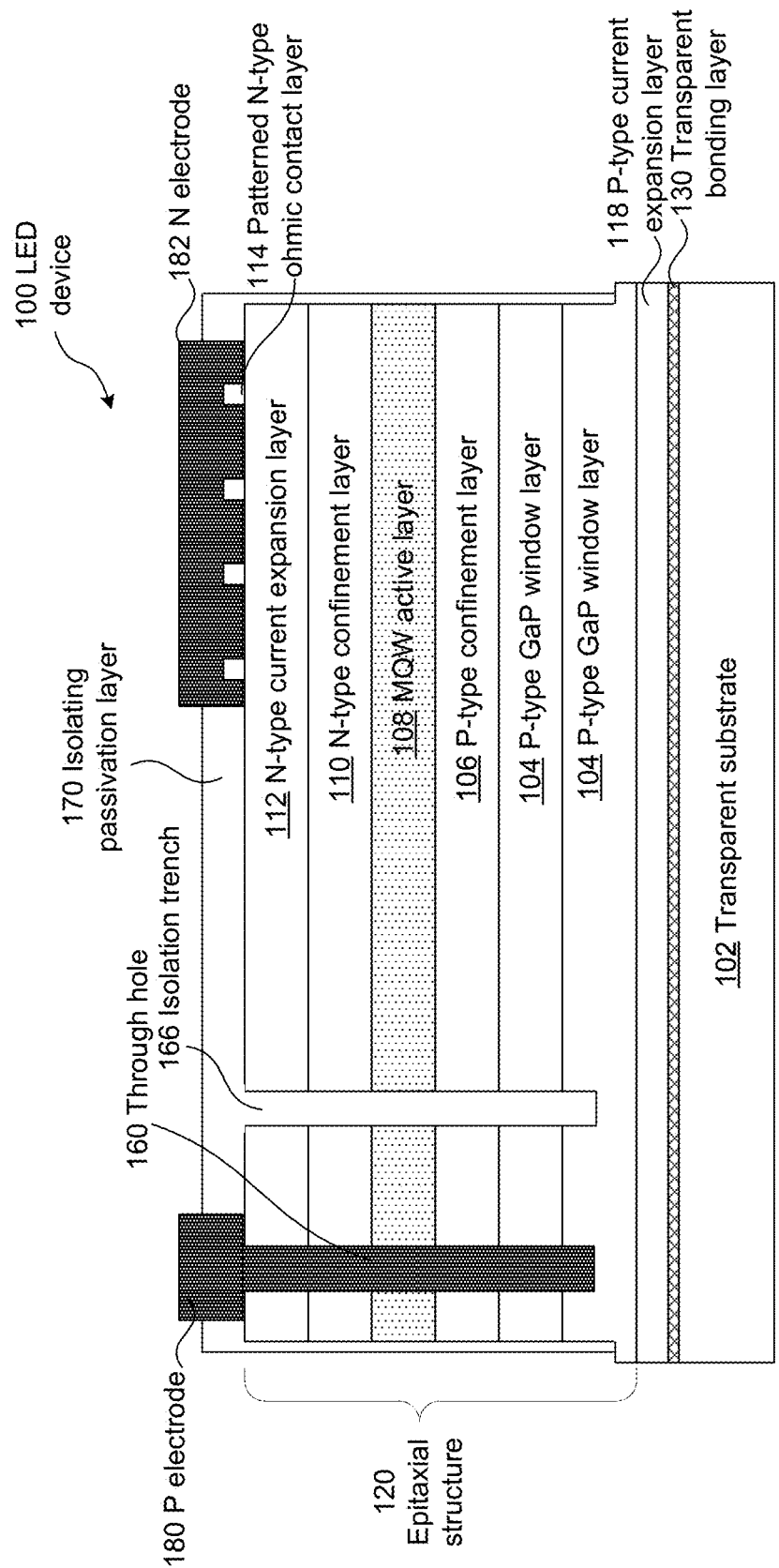
FIG. 2 schematically illustrates an LED device fabricated using an AlGaInP LED epitaxial structure.

A transparent conductive oxide 118 is deposited on a surface of the P-type GaP window layer 104 as a current expansion layer (also referred to as P-type current expansion layer 118 or transparent oxide current expansion layer 118). The epitaxial structure 120 is bonded to the transparent substrate 102 by a transparent bonding layer 130. Then, the GaAs substrate 140, the GaAs buffer layer 142, and the GaInP etch-stop layer 144 are removed such that a patterned N-type GaAs ohmic contact layer is formed. An isolation trench 166 (also referred to as isolation channel) between the P and N electrodes and a through hole 160 (also referred to as P electrode through hole) below the P electrode 180 are formed by etching. An insulating passivation layer 170 is deposited. Then, P electrode 180 and N electrode 182 are fabricated to form an LED device. FIG. 2 schematically illustrates an LED device formed by the process.

In some embodiments, the distance between the P-type GaP window layer 104 and an exposed surface of the N-type current expansion layer 112 can be, e.g., from about 3 µm to about 10 µm, from about 1 µm to about 20 µm, or from about 0.2 µm to about 50 µm. In other words, if the P electrode 180 is disposed directly on the p-type GaP window layer 104, the height difference between the P electrode 180 and the N electrode 182 can be, e.g., from about 3 µm to about 10 µm, from about 1 µm to about 20 µm, or from about 0.2 µm to about 50 µm. Such a significant height difference between the electrodes can be detrimental to the packaging process. In contrast, as shown in FIG. 2, the P electrode 180 has a through hole 160 (or multiple through holes), and at least a portion of the P electrode 180 is disposed above the N-type layers as shown in FIG. 2. As a result, the P electrode 180 can achieve the same height as the N electrode 182. In other words, a top surface of the P electrode 180 is horizontally aligned with a top surface of the N electrode 182. The horizontal direction is a direction parallel to a surface of the transparent substrate 102 (e.g., the surface of the transparent substrate 102 that is in direct contact with the transparent bonding layer 130 or the transparent oxide current expansion layer 118). In some embodiments, the top surface of the P electrode 180 and the top surface of the N electrode 182 can be deemed to be horizontally aligned if any displacement between the surfaces along a direction orthogonal to the horizontal direction is no greater than 10 µm, no greater than 5 µm, or no greater than 1 µm.

The elevated P electrode 180 is electrically connected to the P-type GaP window layer 104 via the through hole 160. In some comparative technologies (e.g., GaN-based LEDs), a thickness of an insulation layer on inner side wall of a through hole is much smaller than a thickness of an insulation layer on a flat surface of a semiconductor layer. When the insulation layer at the bottom of the through hole is etched while attempting to retain the insulation layer disposed on the entire sidewall, the insulation layer on the sidewall can be easily etched away, due to the poor protection from the photoresist. Thus, electrical leakage may occur due to the corroded insulation layer on the sidewall. In contrast, the aspect ratio of the through hole for AlGaInP-based LEDs is relatively high. (The aspect ratio refers to the depth of the through hole divided by the width of the aperture of the through hole.) As shown in FIG. 2, in some embodiments, there is no insulating passivation layer coated on the inner side wall of the through hole 160 of the P electrode 180.

In some embodiments, the isolation trench 166 is disposed between the P electrode 180 and the N electrode 182, which prevents electrical leakage between the P and N electrodes 180, 182. The isolation trench 166 extends through the N-type current expansion layer 112, the N-type confinement layer 110, the multiple quantum wells (MQW) active layer 108, the P-type confinement layer 106, and until the P-type GaP window layer 104. The isolation trench 166 electrically isolates the P electrode 180 from the N electrode 182. Thus, the isolation trench 166 prevents electrical leakage through the sidewall of the P electrode through hole 160.

In some embodiments, the transparent conductive oxide 118 is disposed as the current expansion layer on the surface of the P-type GaP window layer 104. Thus, the P-side current is uniformly expanded, even though the P-type GaP window layer is relatively thin.

Figure 3:
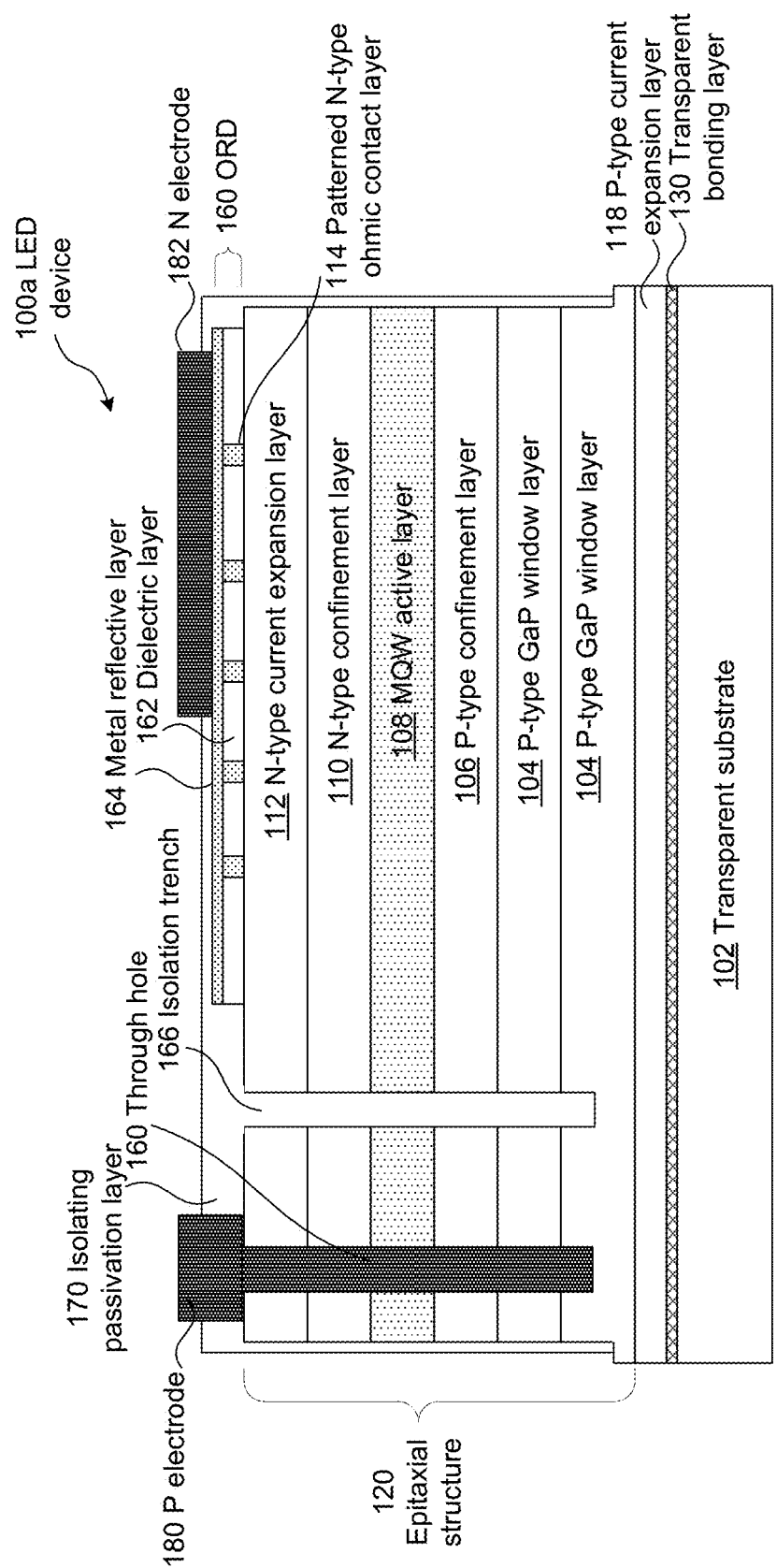
FIG. 3 schematically illustrates an LED device including an omnidirectional reflector (ODR).

According to at least some embodiments of the present disclosure, an LED device as described herein can also include an omnidirectional reflector (ODR) for improving light efficacy. FIG. 3 schematically illustrates an LED device including an ODR. The LED device 100a as illustrated in FIG. 3 is similar to the LED device 100 as illustrated in FIG. 2, except that an ODR 160 is disposed between the epitaxial structure 120 and the N electrode 182. In particular, the ODR 160 is formed on the N-type current expansion layer 112, to enhance the light output on the transparent substrate side of the LED chip 100a. The ODR 160 includes a metal reflective layer 164 and a dielectric film 162 with a low refractive index. Such an ODR 160 has a reflectivity higher than that of a comparative ODR including a conductive layer, an adhesion layer and a metal reflective layer, therefore further enhancing the light output efficacy of the LED chip 100a.

Figure 4:
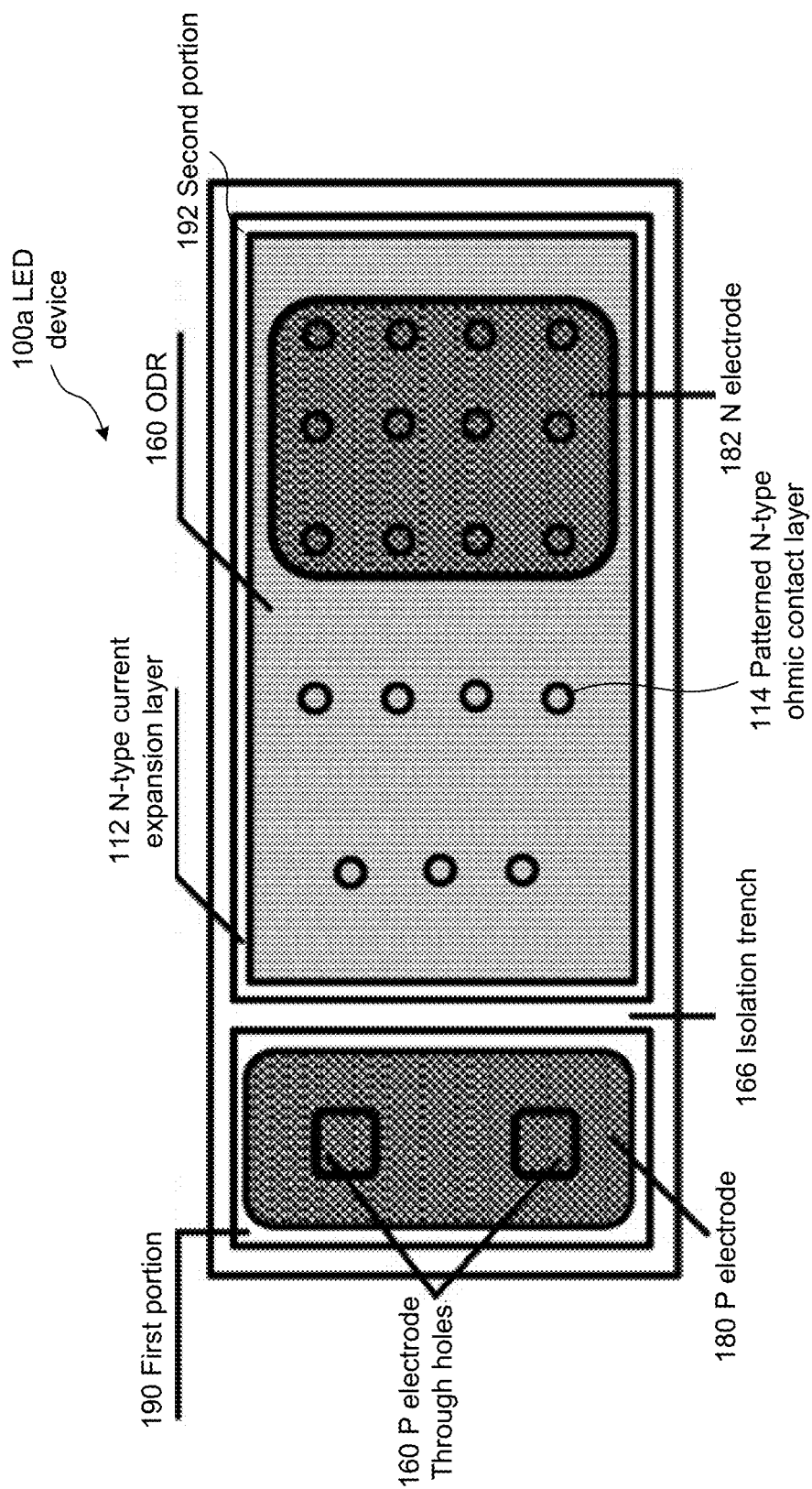
FIG. 4 schematically illustrates a top view of an LED device including an ODR.

FIG. 4 schematically illustrates a top view of an LED device including an ODR. In the LED chip 100a shown in FIG. 4, the isolation trench 166 is formed between the P electrode 180 and the N electrode 182 by, e.g., lithography. One or more through holes 160 are formed below the P electrode 180 by, e.g., lithography. The depth of the lithography dry etching at least reaches the P-type GaP window layer 104 (not shown), and may further reach the current expansion layer 118 formed by a transparent oxide (e.g., ITO, not shown). As a result, the isolation trench 166 divides the epitaxial structure 120 into two portions. A first portion 190 of the epitaxial structure 120 supports the P channel. A second portion 192 of the epitaxial structure 120 supports the ODR 160 and the N electrode 182.

FIG. 5 schematically illustrates a flow chart of a method of manufacturing an LED chip. At step 505 of the process 500, the method sequentially epitaxially grows a GaAs buffer layer, a GaInP etch-stop layer, an N-type GaAs ohmic contact layer, an N-type current expansion layer, an N-type confinement layer, an MQW active layer, a P-type confinement layer, and a P-type GaP window layer on a GaAs temporary substrate, to form an AlGaInP-based LED epitaxial structure.

At step 510, the method deposits a transparent conductive oxide layer (e.g., ITO) as a current expansion layer on the P-type GaP window layer of the epitaxial structure.

At step 515, the method bonds the epitaxial structure to a transparent substrate by using a transparent bonding material to form a bonded structure. The bonding technology may be, e.g., BCB bonding, spin-on-glass (SOG) bonding, silicone rubber bonding, oxide bonding, etc.

At step 520, the method removes the GaAs temporary substrate, the GaAs buffer layer and the GaInP etch-stop layer from the bonded structure to expose the n-type GaAs ohmic contact layer.

At step 525, the method forms a pattern on the surface of the N-type GaAs ohmic contact layer by, e.g., lithography with photoresist masks. In some embodiments, the photoresist has not been removed yet.

At step 530, the method deposits a dialectic film (e.g., $MgF_2$) on the surface of the N-type GaAs ohmic contact layer, as a dielectric film layer of an ODR, and forms through holes of the dielectric film by a lift-off process. The through holes of the dielectric film accommodate the patterns of the N-type GaAs ohmic contact layer. In some embodiments, since the steps 525 and 530 may share the same layer of photoresist pattern, the through holes are aligned with the patterned N-type GaAs ohmic contact layer.

At step 535, the method deposits a metal reflective layer (e.g., AuGeNi, Au, Pt, Au, etc.) on the surface of the dielectric film layer, as the metal reflective layer of the ODR. The metal layer serves as a reflection layer for the ODR and as a conductive channel for electrical contact with the N-type GaAs ohmic contact layer and the N-type GaAs current expansion layer via the through holes of the dielectric film.

At step 540, the method forms an isolation trench between the P electrode and the N electrode and at least one through hole (or multiple through holes) below the P electrode by, e.g., lithography. The depth of the lithography dry etching at least reaches the P-type GaP window layer, and may further reach the P-type current expansion layer formed by a transparent oxide (e.g., ITO). The isolation trench and the P electrode through hole may be formed by a single lithography process. Alternatively, the isolation trench and the P electrode through hole may be respectively formed by multiple lithography processes.

In some comparative embodiments, instead of forming the isolation trench and the through hole by lithography, a P electrode mesh can be formed directly on the P-type layers by lithography. The depth of the lithography dry etching may at least reach the P-type GaP window layer, and may further reach the P-type current expansion layer formed by a transparent oxide (e.g., ITO). However, without the structure including the elevated P electrode, the through hole and the isolation trench, the P and N electrodes have different heights. In other words, a top surface of the P electrode is not horizontally aligned with a top surface of the N electrode, causing difficulty for chip packaging and bonding during the flip-chip process.

At step 545, the method deposits a passivation layer (e.g., SiN, $Al_2O_3$, or $SiO_2$). At least some of the passivation layer is disposed within the isolation trench. Thus, the P electrode is electrically isolated from the N electrode by the isolation trench.

At step 550, the method forms the P electrode and the N electrode by a deposition and lift-off process. Through an annealing process, the P and N electrodes form ohmic contacts with the current expansion layer formed by, e.g., the transparent oxide (e.g., ITO). At least a portion of the N electrode is fused with the metal reflective layer of the ODR to form a proper electrically conductive path.

At step 555, the method finalizes an LED chip by further processes such as substrate thinning, singulation, splitting, etc.

Although various examples described and illustrated herein disclose that various layers include semiconductor materials (undoped, N-doped, or P-doped semiconductors), it is to be understood that the technology disclosed herein may be applied to chips including various types of semiconductor materials, such as gallium nitride (GaN) and/or aluminum nitride (AlN), indium nitride (InN), gallium arsenide (GaAs), aluminum arsenide (AlAs), indium arsenide (InAs), aluminum phosphide (AlP), gallium phosphide (GaP), indium phosphide (InP), aluminum antimonide (AlSb), gallium antimonide (GaSb), indium antimonide (InSb), or any compound or alloy thereof (e.g., AlGaN, GaInN, AlInN, AlGaInN, AlGaAs, GaInAs, AlInAs, AlGaInAs, AlInP, GaInP, AlGaInP, AlInSb, GaInSb, AlGaSb, AlGaInSb, etc.). In other words, the semiconductor material may be formed of, or at least include, e.g., a nitride compound, an alloy of nitride compounds, an arsenide compound, an alloy of arsenide compounds, a phosphide compound, an alloy of phosphide compounds, an antimonide compound, an alloy of antimonide compounds, a ternary alloy of group III elements and group V elements, or a quaternary alloy of group III elements and group V elements.

As used herein, the singular terms "a," "an," and "the" may include plural referents unless the context clearly dictates otherwise.

Spatial descriptions, such as "overlying" "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A light-emitting diode (LED) device, comprising:
    a transparent substrate;
    an epitaxial structure disposed above the transparent substrate, the epitaxial structure defining an isolation trench dividing the epitaxial structure into a first portion and a second portion, the epitaxial structure defining at least one through hole extending through the first portion;
    an insulating passivation layer, at least a portion of the insulating passivation layer disposed in the isolation trench;
    a P electrode disposed above and in physical contact with the first portion of the epitaxial structure and in the at least one through hole; and
    an N electrode disposed above and in physical contact with the second portion of the epitaxial structure.

2. The LED device of claim 1, wherein a top surface of the P electrode is horizontally aligned with a top surface of the N electrode.

3. The LED device of claim 1, wherein the isolation trench electrically isolates the P electrode from the N electrode.

4. The LED device of claim 1, wherein the epitaxial structure is an AlGaInP LED epitaxial structure.

5. The LED device of claim 1, wherein the epitaxial structure comprises:
    one or more P-type layers disposed above the transparent substrate;
    a multiple quantum well (MQW) active layer disposed above the one or more P-type layers; and
    one or more N-type layers disposed above the MQW active layer.

6. The LED device of claim 5, wherein the at least one through hole extends through the one or more N-type layers and the MQW active layer, and extends into at least one of the one or more P-type layers.

7. The LED device of claim 5, wherein the P electrode forms an ohmic contact with at least one of the one or more P-type layers via the at least one through hole.

8. The LED device of claim 5, wherein the isolation trench extends through the one or more N-type layers and the MQW active layer, and extends into at least one of the one or more P-type layers.

9. The LED device of claim 5, wherein the isolation trench filled with at least a portion of the insulating passivation layer prevents an electrical leakage between the P electrode and the N electrode.

10. The LED device of claim 5, wherein the one or more P-type layers comprise a transparent P-type current expansion layer, a P-type window layer, and a P-type confinement layer, wherein the one or more N-type layers comprise an N-type confinement layer and an N-type current expansion layer, and wherein the at least one through hole and the isolation trench extend into the P-type window layer.

11. The LED device of claim 10, further comprising:
    an N-type ohmic contact layer disposed between the N-type current expansion layer and the N electrode;
    wherein the N electrode forms an ohmic contact with the N-type current expansion layer via the N-type ohmic contact layer.

12. A method of manufacturing a light-emitting diode (LED) device, comprising:
    fabricating an LED epitaxial structure;
    depositing a transparent current expansion layer on a surface of the LED epitaxial structure;
    bonding the LED epitaxial structure onto a transparent substrate with the transparent current expansion layer disposed between the LED epitaxial structure and the transparent substrate;
    forming an isolation trench dividing at least some layers of the epitaxial structure into a first portion and a second portion;

forming one or more through holes extending through the first portion of the epitaxial structure; and disposing an N electrode above the second portion of the epitaxial structure and a P electrode above the first portion of the epitaxial structure and in the one or more through holes.

13. The method of claim 12, wherein a top surface of the P electrode is horizontally aligned with a top surface of the N electrode, and the P electrode forms an ohmic contact with at least one of P-type layers of the LED epitaxial structure via the one or more through holes.

14. The method of claim 12, wherein surface of the LED epitaxial structure is a second surface of the LED epitaxial structure, the method further comprising:

removing a temporary substrate from a first surface of the LED epitaxial structure, wherein the transparent substrate is bonded to the second surface of the LED epitaxial structure opposite to the first surface.

15. The method of claim 12, further comprising:
forming a patterned N-type GaAs ohmic contact layer on the LED epitaxial structure.

16. The method of claim 12, further comprising:
depositing an insulating passivation layer, at least a portion of the insulating passivation layer disposed in the isolation trench.

17. The method of claim 12, further comprising:
disposing an omnidirectional reflector (ODR) comprising a dielectric film and a metal reflective layer;
wherein the dielectric film is disposed above the second portion of the epitaxial structure, and the metal reflective layer is disposed above the dielectric film.

18. The method of claim 17, wherein the dielectric film defines holes that accommodate at least a portion of a patterned N-type ohmic contact layer, and the N electrode forms an ohmic contact with the second portion of the epitaxial structure via the metal reflective layer and the patterned N-type ohmic contact layer disposed in the holes of the dielectric film.

* * * * *